US010381276B2

(12) United States Patent
Iruvanti et al.

(10) Patent No.: US 10,381,276 B2
(45) Date of Patent: Aug. 13, 2019

(54) TEST CELL FOR LAMINATE AND METHOD

(71) Applicant: International Business Machines Corporation, Armonk, NY (US)

(72) Inventors: Sushumna Iruvanti, Wappingers Falls, NY (US); Shidong Li, Poughkeepsie, NY (US); Marek A. Orlowski, Fishkill, NY (US); David L. Questad, Hopewell Junction, NY (US); Tuhin Sinha, Hackensack, NJ (US); Krishna R. Tunga, Wappingers Falls, NY (US); Thomas A. Wassick, LaGrangeville, NY (US); Randall J. Werner, Poughkeepsie, NY (US); Jeffrey A. Zitz, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/973,165

(22) Filed: Dec. 17, 2015

(65) Prior Publication Data
US 2017/0178982 A1  Jun. 22, 2017

(51) Int. Cl.
*H01L 21/48* (2006.01)
*G06F 17/50* (2006.01)
(Continued)

(52) U.S. Cl.
CPC .......... *H01L 22/32* (2013.01); *G06F 17/5068* (2013.01); *H01L 21/486* (2013.01);
(Continued)

(58) Field of Classification Search
CPC .............. H01L 21/486; H01L 21/4857; H05K 2201/09781; H05K 2201/0979; H05K 2201/10734; H05K 2201/09627; H05K 3/4602; H05K 999/00; H05K 1/0268; H05K 2201/09409; H05K 2201/09418; H05K 1/0266; H05K 1/114; H05K 1/115;
(Continued)

(56) References Cited

U.S. PATENT DOCUMENTS

| 23,445 A | 4/1859 | Chambers, Jr. |
| 123,144 A | 1/1872 | Bennett |

(Continued)

FOREIGN PATENT DOCUMENTS

| EP | 2541415 A1 | 1/2013 |
| JP | 2003031933 A * | 1/2003 |

OTHER PUBLICATIONS

Original of Ito (JP2003031933A) provided with Office Action.*
(Continued)

*Primary Examiner* — Roshn K Varghese
(74) *Attorney, Agent, or Firm* — Cantor Colburn LLP; Steven Meyers

(57) ABSTRACT

A laminate includes a plurality of buildup layers disposed on a core and a plurality of unit cells defined in the buildup layers. Each unit cell includes: at least one test via that passes through at least two of the buildup layers and that is electrically connected to testing locations on a probe accessible location of the laminate; and two or more dummy vias disposed in the unit cell. The dummy vias are arranged in the unit cell at one of a plurality of distances from the test via.

11 Claims, 6 Drawing Sheets

(51) Int. Cl.
*H01L 21/66* (2006.01)
*H01L 23/498* (2006.01)

(52) U.S. Cl.
CPC .... *H01L 21/4857* (2013.01); *H01L 23/49822* (2013.01); *H01L 23/49827* (2013.01); *H01L 23/49866* (2013.01); *H01L 2224/16225* (2013.01); *H01L 2924/15311* (2013.01)

(58) Field of Classification Search
CPC .... H05K 1/116; H05K 1/0246; H05K 1/0251; H05K 2201/09281; G01R 31/2853; G06F 17/5068
See application file for complete search history.

(56) References Cited

U.S. PATENT DOCUMENTS

| | | | | |
|---|---|---|---|---|
| 4,477,484 A | * | 10/1984 | Paoletti | G01N 27/041 427/10 |
| 5,172,063 A | * | 12/1992 | Munikoti | G01R 31/281 324/537 |
| 5,180,440 A | * | 1/1993 | Siegel | G09B 19/24 174/263 |
| 5,956,843 A | * | 9/1999 | Mizumoto | H05K 1/113 174/257 |
| 6,175,088 B1 | * | 1/2001 | Saccocio | H05K 1/113 174/255 |
| 6,388,890 B1 | * | 5/2002 | Kwong | H05K 1/112 174/255 |
| 6,391,669 B1 | * | 5/2002 | Fasano | H01L 22/34 29/593 |
| 6,462,570 B1 | * | 10/2002 | Price | G01R 31/2818 324/756.02 |
| 6,596,549 B2 | * | 7/2003 | Kitamura | G06F 17/5077 438/123 |
| 7,098,680 B2 | * | 8/2006 | Fukushima | G01R 31/2889 324/756.02 |
| 7,119,563 B2 | * | 10/2006 | Casey | G01R 31/2889 324/756.05 |
| 7,388,394 B1 | * | 6/2008 | Primavera | G01R 31/2805 324/750.24 |
| 7,420,229 B2 | | 9/2008 | Schultz et al. | |
| 7,441,221 B2 | * | 10/2008 | Kawamichi | G06F 17/5068 716/137 |
| 7,863,733 B2 | | 1/2011 | Flautner et al. | |
| 7,955,485 B2 | | 6/2011 | Gregory | |
| 8,178,876 B2 | | 5/2012 | Hess et al. | |
| 8,732,632 B1 | | 5/2014 | Keller et al. | |
| 2005/0194649 A1 | * | 9/2005 | Oki | H01L 22/14 257/409 |
| 2007/0029106 A1 | * | 2/2007 | Kato | H01L 23/49822 174/255 |
| 2008/0169121 A1 | * | 7/2008 | Suehiro | G01R 31/048 174/255 |
| 2008/0204037 A1 | * | 8/2008 | Fukami | G01R 31/2805 174/250 |
| 2008/0217052 A1 | * | 9/2008 | Matsui | H05K 1/0268 174/266 |
| 2015/0114707 A1 | * | 4/2015 | Glickman | H05K 1/0206 174/264 |

OTHER PUBLICATIONS

Machine translation of Ito (JP2003031933A) provided with Office Action.*
Marinissen, Verbree, Knonijnenburg, "A Structured and Scalable Test Access Architecture for TSV-Based 3D Stacked ICS." 28th IEEE VLSI Test Symposium, 2010, pp. 269-274. 6 pages.
List of IBM Patents or Patent Applications Treated as Related; (Appendix P), Filed Nov. 16, 2017; 2 pages.
Iruvanti, et al. "Test Cell for Laminate and Method" U.S. Appl. No. 15/813,536, filed Nov. 15, 2017, 17 pages.

* cited by examiner

|    | 1 | 2 | 3 | 4 | 5 | 6 | 7 | 8 | 9 | 10 | 11 | 12 |
|----|---|---|---|---|---|---|---|---|---|----|----|----|
| 14 | A | A | A | A | A | A | A | A | A | A  | A  | A  |
| 13 | A | A | A | C | A | A | A | C | A | A  | A  | A  |
| 12 | A | A | E | D | D | D | D | D | E | E  | A  | A  |
| 11 |   | C | E | E |   | E | E |   | E | E  | C  |    |
| 10 | A | D | E | B | A | A | A | A | E | C  | A  |    |
| 9  | A | D | A | A | A | A | A | A | A | D  | A  |    |
| 8  | A | A | E | A | A | A | A | A | A | E  | A  | A  |
| 7  | A | A | E | A | A | A | A | A | A | E  | A  | A  |
| 6  | A | D | A | A | A | A | A | A | A | A  | A  |    |
| 5  | A | D | E | B | A | A | A | B | E | D  | A  |    |
| 4  | A | C | E | E |   | E | E |   | E | E  | C  |    |
| 3  | A | A | E | E | D | D | D | D | C | A  | A  |    |
| 2  | A | A | A | C | A | A | A | C | A | A  | A  |    |
| 1  | A | A | A |   | A | A | A | A |   | A  | A  | A  |
| 0  | A | A | A | A | A | A | A | A | A | A  | A  |    |

FIG. 5

TEST CELL FOR LAMINATE AND METHOD

BACKGROUND

The present invention relates to microelectronic devices and, and more specifically, to testing structures within laminates for such devices.

Once formation of semiconductor devices and interconnects on a semiconductor wafer is completed, the semiconductor wafer is diced into semiconductor chips, or "dies." Functional semiconductor chips are then packaged to facilitate mounting to a larger device.

The packaging generally provides mechanical protection and electrical connections to an external element. One typical packaging technology is Controlled Collapse Chip Connection (C4) packaging, which employs C4 balls each of which contacts a C4 pad on the semiconductor chip and another C4 pad on a packaging substrate.

SUMMARY

According to an embodiment of the present invention, a laminate that includes a plurality of buildup layers disposed on a core is disclosed. The laminate includes a plurality of unit cells defined in the buildup layers. Each unit cell includes: at least one test via that passes through at least two of the buildup layers and that is electrically connected to testing locations on a probe accessible location of the laminate; and two or more dummy vias disposed in the unit cell. The dummy vias are arranged in the unit cell at one of a plurality of distances from the test via.

According to another embodiment of the present invention, a method of designing a laminate is disclosed. The method includes forming a test laminate that includes: a plurality of buildup layers disposed on a core; one or more unit cells defined in the buildup layers, each unit cell including: at least one test via that passes through at least two of the buildup layers and that is electrically connected to testing locations on a probe accessible location of the laminate; and two or more dummy vias disposed in the unit cell, wherein the dummy vias are arranged in the unit cell at one of a plurality of distances from the test via. The method also includes subjecting test laminate to a stress; testing at least one of the one more unit cells; determining that at least one of the one or more unit cells is a failed cell; and designing the laminate such that it does not include a via configuration that generates via stress equal or higher than that from the failed cell in a location under a computer chip where the failed cell was located. The method may also include calculating the stresses and strains at the failed via location using numerical simulations such as, for example, a. Finite element method (FEM).

According to yet another embodiment of the present invention a module that includes a laminate and a die connected to the laminate is disclosed. The laminate includes a plurality of unit cells defined in the buildup layers. Each unit cell includes: at least one test via that passes through at least two of the buildup layers and that is electrically connected to testing locations on a probe accessible location of the laminate; and two or more dummy vias disposed in the unit cell. The dummy vias are arranged in the unit cell at one of a plurality of distances from the test via.

BRIEF DESCRIPTION OF THE DRAWINGS

FIG. 5 is an example layout of unit cells; and

DETAILED DESCRIPTION

Figure 1:
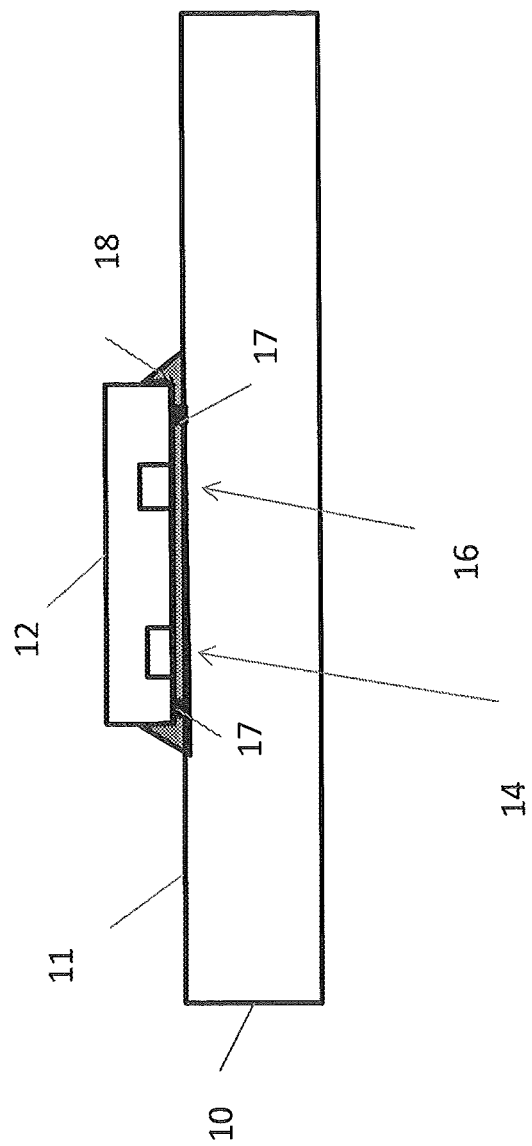
FIG. 1 shows an example of a laminate with a die secured thereto including a layer of underfill.

With reference now to FIG. 1, the packaging substrate 10 is shown and may be referred to herein as a "laminate" from time to time. The chip or die 12 is illustrated attached to a top surface 11 of the laminate 10. Further, during operation, the die 12 itself can cause stress to exist in the laminate 10. For example, during operation, the die 12 may develop local hot spots (e.g., under a core) that are shown by regions 14, 16. It has been discovered that these hot spots may cause stresses in the package due to differences in the coefficient of thermal expansion (CTE) in the materials in the laminate and the die 12. In FIG. 1, example of such connections are shown by connectors 17 and can be formed by C4 balls.

Also illustrated is an underfill layer 18. Underfill is generally dispensed on a corner or in a line along the edge of the die at an elevated temperature and it flows in the cavity between the die 12, the laminate and the connectors due to capillary action. Once the dispense is completed, the underfill is cured at high temperature till it solidifies and thereafter, the entire assembly is cooled down to room temperature. The packaging substrate may then be assembled on a larger circuit board. The combined chip and laminate may be referred to as a module in some cases. Of course, a module may include other elements such as a lid and one or more heat sinks.

Figure 2:
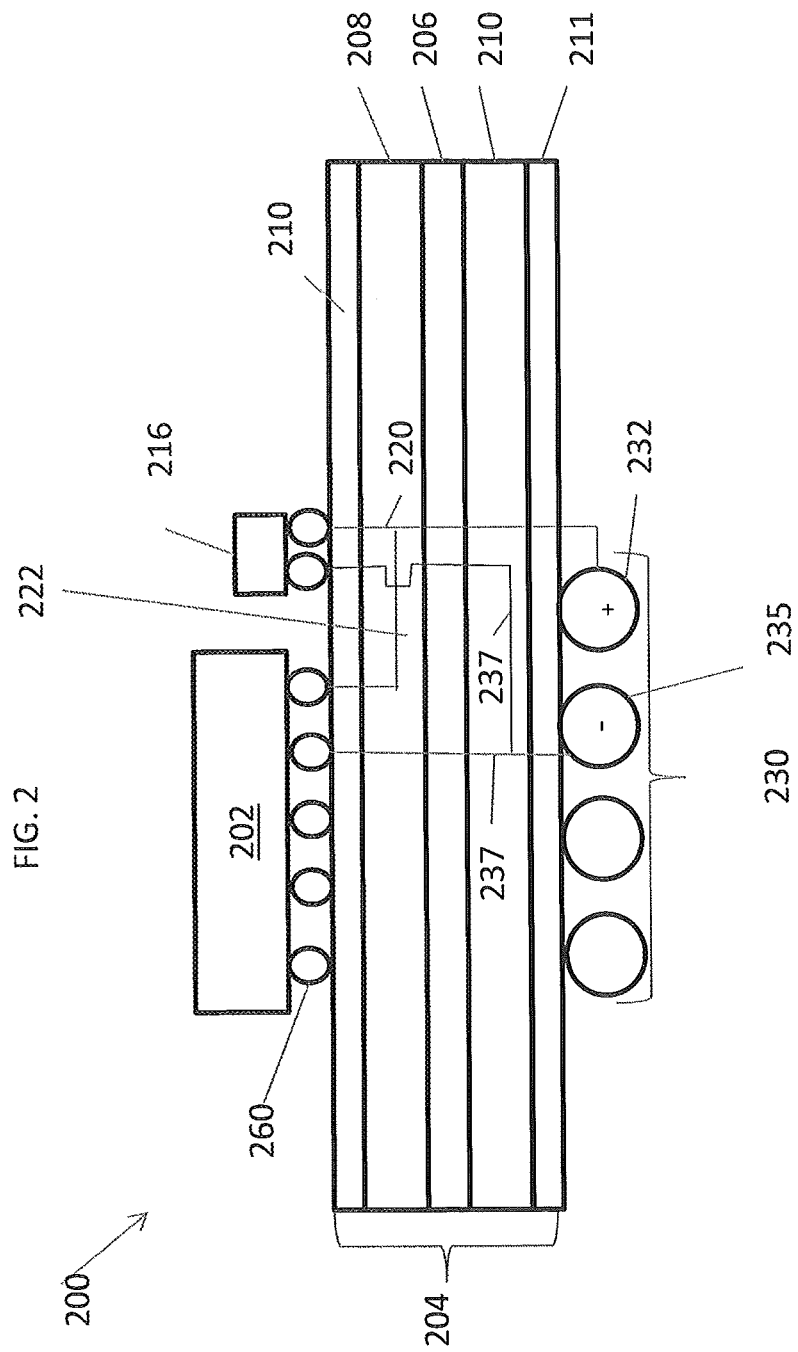
FIG. 2 shows a side view of an example of laminate having a die connected thereto.

Provided herein is a method and systems to characterize the properties of stacked vias in a layered buildup layer portion of a laminate. In one embodiment, the disclosed systems and methods may address the problem of stacked via failure in organic laminates. Such may be achieved, for example, by forming via structures and layouts to address failure isolation and evaluate a set of key variables that can influence the stress of a via stack chain. Known solutions to this idea usually encompass long daisy chains of via stack heights. Isolation of which stack has failed as well as which via to via connection has failed is problematic and usually requires time consuming destructive failure analysis With reference now to FIG. 2, a simple block diagram of a portion of a microelectronic device 200 is shown. The device 200 includes a chip 202. The chip can be an integrated circuit or other type of device and is sometimes referred to as die. A decoupling capacitor or other supplementary element 216 (e.g., a resistor, inductor, voltage regulator) may also be supported. The purpose of such elements is known.

The chip 202 and element 216 are supported by and carried on a laminate 204. The laminate 204 may be formed (but need not be) such that it includes a core 206. The core 206 may be formed of a glass-cloth polymer.

The laminate 204 also includes a top buildup layers portion 208 and a bottom buildup layers portion 210. The top and bottom buildup layers portions are typically formed of an organic composite polymer. The buildup layers portions, as will be understood, may include several individual layers therein, each of which may be referred to as a buildup layer.

The bottom buildup layers portions 210 may include means for connecting a ball grid array 230 so that power, ground and data can be delivered from external to the chip 202 or vice versa. Of course, the ball grid array 230 may be replaced with a so-called land grid array in certain instances. This allows the module (combination of chip 202 and laminate 204) to be connected, for example, to a printed circuit board.

A solder mask 210 may be formed on top of the top buildup layers portion 208. The solder mask 210 includes openings for connections from the chip 202 and element 216 to the laminate 204. As shown, solder balls 260 are used to for such connections. Of course, other connection mechanisms may be utilized. To make the connections, a reflow process is performed that may give rise to the stresses on the laminate described above. In some cases, a solder mask 211 is also formed on the bottom of the laminate 204.

During operation, a switching signal may be received from a power element 232 of the array 230. The signal traverses connections 220 to a capacitor 216 and the die 202. While shown as a direct line, the connection 220 may pass through one or more vias in buildup layers portions 208, 210 to traverse different levels therein. As such, connections 220 are illustrative only. The signal received by capacitor 216 through connection 220 is also provided to a power terminal of the die 202 through connection 222. Of course, the connection 222 may pass through multiple vias in buildup layers portions 208, 210 to traverse different levels therein The capacitor 216 may be referred to as "de-coupling capacitor" in some cases. The purpose of the capacitor 216, in such a case, is to provide a "near" power supply to thereby reduce inductive losses in the switching signal. Both the capacitor 216 and the die 202 are connected to a common ground or negative terminal 235 in the illustrated embodiment along connection 237.

Figure 3:
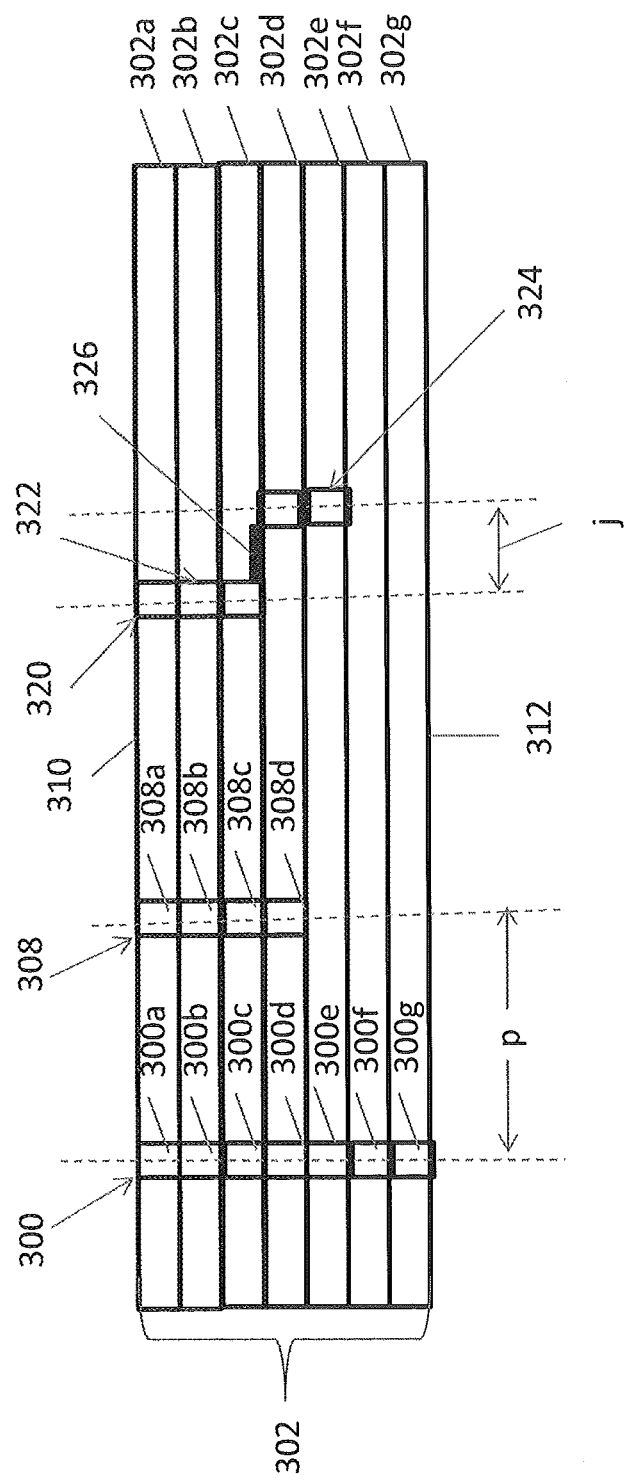
FIG. 3 shows an example of a laminate with various different layers and types and sizes of vias passing disposed in it.

As discussed briefly above, the connections 220, 222 may pass through vias in different layers of the buildup layers portions. In FIG. 3, an example of a via 300 is shown. The via is formed such that it traverses several sublayers 302a-g of a buildup layers portion 302. During operation and processing, the laminate may be exposed to certain thermally induced stresses. These thermally induced stresses may cause physical stresses that cause a via to fail. For example, different CTE's between via, wiring, or any elements in the laminate may create such stresses when the laminate is exposed to heat.

As illustrated, 302a-g form seven different layers. In some cases, a different number of layers may be utilized. As shown the via 300, includes 7 segments 300a-300g. The seven segments may vary and, in one embodiment, the number of layers determines an upper limit on the number of segments. As is known, the via may include contacts to wiring a surface of one or more of the layers. Also, in some cases, multiple vias may be in close proximity to one another. The wiring may connect one via to one or more other via.

When designing a board layout it is important to know whether a particular configuration of nearby via, wiring and via height may be robust enough for a particular situation. For example, it may be important to know if a particular orientation will be able to withstand processing such as a reflow, stresses caused by operation (e.g., local hot spots due to die core heating) and CTE mismatch induced stresses. Testing for via fails has, historically, been difficult as such testing typically includes daisy chained vias. Herein, a unit cell is defined. The unit cell includes a single test via that can vary from a stack up height of at least 2 and a tap point at a level. The stack up height, as the term is used herein, refers to the number of layers the via traverses. For example, the stack up height shown in by via 300 is seven while the stack up height of via 308 is 4. Via 308 is located such that it contacts the top 310 of the buildup layers portions. The bottom 312 of the buildup layers portion 302 may contact the core of a laminate (e.g., core 206 of FIG. 2). Vias that contact the top are said to have a "top z location" and those that contact the bottom are said to have a "bottom z location." In later discussion, a via pitch is referred to. Such a via pitch is the distance between two adjacent vias. In FIG. 3, the via pitch is shown by distance p. In some instances, a via may not consist of only vertically aligned segments. For example, via 320 includes an upper segment 322 joined by a connection 326 on an upper surface of layer 302d to a lower segment 324. The distance between the upper and lower segments 322 and 326 is referred to as a jog distance and is shown by a distance j.

Also, each type of via shown in FIG. 3 may be arranged under a die. The location under the die may be under the center of the die, at a corner of the die and at a point anywhere between the center of the die and an edge of the die.

In the following discussion it shall be assumed that a heat related event (e.g., a reflow or other build process, or die related heat or temperature excursions) can cause a location on the via to fail and that failures do not typically occur along layer surface based connections (e.g., in the connections between vias or along a jog).

The above definitions for the stack-up height, via location, pitch and z location define a set of primary variables. That is, in one embodiment, a unit cell as described below will include at least one test via that has either an individual variable or a unique combination of all four of these variables. As understood, in order for pitch to exist, at least one other secondary or dummy via must be located within the unit cell. Further, the test via includes a connection across each level it traverses to which a probe may be attached. By measuring from the top or bottom of the test via to each of the probe connections, the exact layer where the via failed (if it failed) may be determined. In one embodiment, the pitch is limited to 3 possible values (125 µm, 150 µm and 180 µm). The number of dummy cells may be limited by the size of a unit cell and the pitch as will be readily understood. In one embodiment, the test via is located in the middle of the unit cell.

Figure 4:
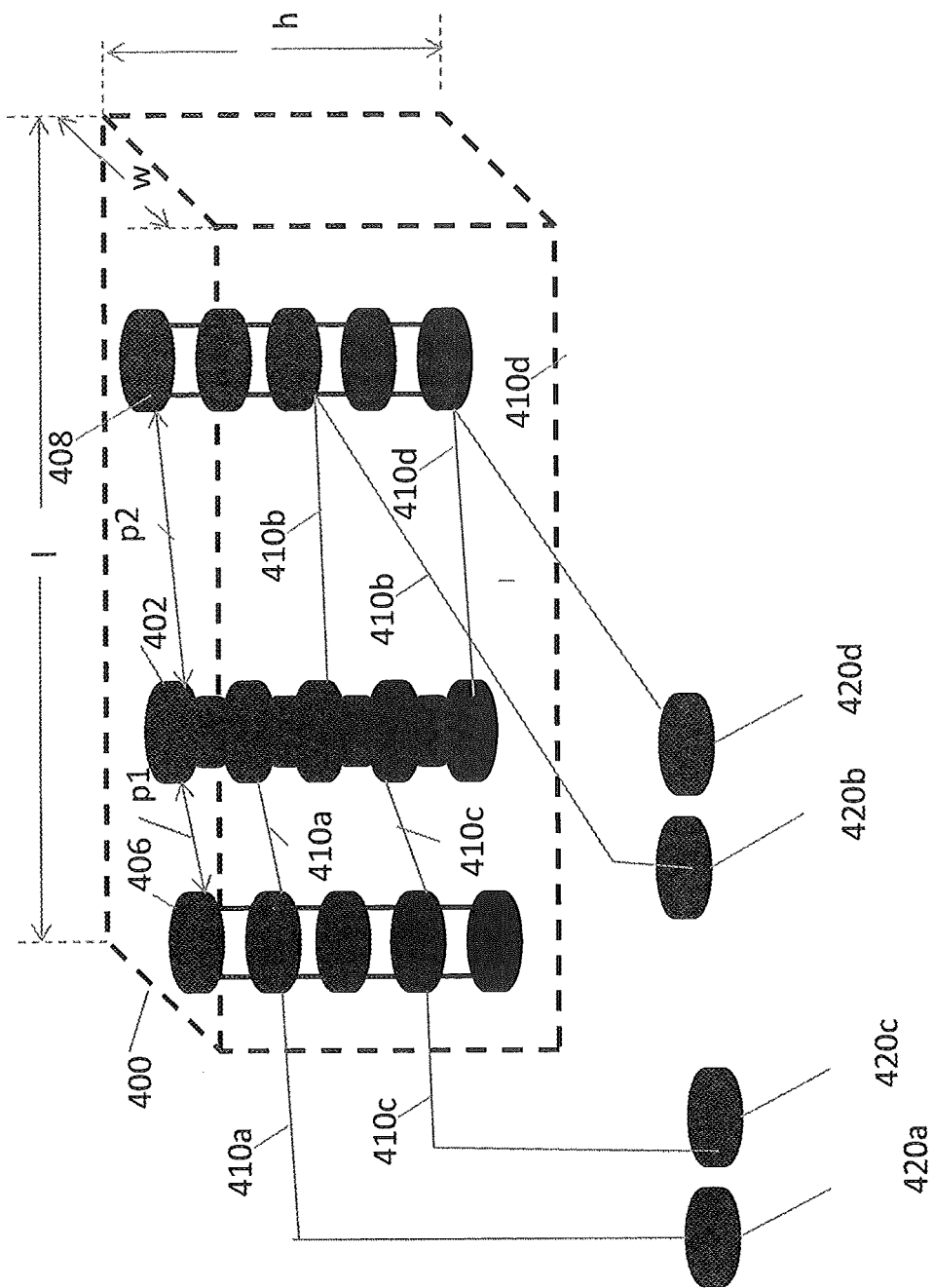
FIG. 4 shows a perspective view of example test and dummy vias arranged in a unit cell.

FIG. 4 shows an example of perspective view of a unit cell 400 that does not include an illustration of the buildup layers. The unit cells includes a length (l) and width (w) and a height (h) defined by the number of buildup sublayers. In the example, a test via 402 is provided. Test via 402 has stack height of 4, the z location is a top z location and the via location may be assumed to be any of the stack locations. The unit cell 400 also includes two dummy via 406, 408. In this case both have top z locations and have stack heights of 4. The (p1, p2) pitch between the test via 402 and the dummy vias 406, 408 may selected from the three described above. At each level of the test via 402, test traces 410a-410d are formed that are connected to respective test probe outputs 420a-d that may be probed from, for example, a bottom of the laminate. As shown, each test trace 410 passes through one of the dummy vias 406, 408. While not required such a path may be the easiest to build.

In addition to the primary variables, other variables may also be used to form a particular, unit cell. These variables include, for examples, whether a via is formed as by resin fill plated through holes (RFPs), differing copper densities (such as standard copper fill, increased copper fill and decreased copper fill), a jog distance for vias having such a jog and the z-location from the top or bottom when a particular via is between 3, 4 and 5 high and does not contact the top or bottom. This may come into consideration when a particular jog distance exceeds certain conditions.

Various combinations of primary and secondary variables are, thus, definable. However, in one embodiment all four primary variables are present in each of the unit cells. The following table lists all of the possible different permutations of each primary variable and, thus, the total number of unit cells that are required to express all permutations in a separate unit cell:

1. Via stack-up height
2 high via stack up to 7 high via stack
Total: 6 cases
2. Via location
Near center, near mid region and near corner
Total: 3 cases
3. Stack via pitch
125 um, 150 um and 185 um
Total: 3 cases
4. Stack via z-location
Contacts the C4 (top down) and Contacts the core (bottom up)
Total: 2 cases for each stack-up height except for 7 stack-up height via The total number of cells for 2 to 6 stack via is: 5×3×3×2=90; the total number of cells for 7 stack via: 3×3=9; total cells=99.

Similarly, the secondary variables can be combined with certain of the primary cells described above. In particular:

1. Presence/Absence of RFP
RFP/No RFP (2)
Primary variables
   Top down 3/4/5/6, Bottom up 2/3/4 (7)
   All three stack via pitches (3)
   Approximately same distance from the chip center
Total cases: 7×3=21
2. Local copper density variation
Three different copper densities (3)
Primary variables
   5 stack-up heights 3 to 7 (5)
   Top down stack-up only (1)
   185 um stack via pitch (1)
   Approximately same distance
   from the chip center
Total cases: 5×3=15
3. Jog distance
2 jog distances: 100 um and 125 um (2)
2-2-2 stack-up and 3-2-1 stack-up (2)
Diagonal Jog
Primary variables
   6 stack-up height only (1)
   Top down stack-up only (1)
   All three stack via pitches (3)
   Approximately same distance from the chip center
Total cases: 2×2×3=12
4. z-Location
Top down, bottom up and hanging stack via
Primary variables
   3, 4 and 5 stack up only (3)
   3 stack: FC3 to FC5
   4 stack: FC2 to FC5
   5 stack: FC2 to FC6
   150 um pitch only
   Approximately same distance from
   the chip center
Total cases: 3

In sum, to capture all primary and secondary variables an additional 51 (21+15+12+3) cells are required. Thus, the total number of cells to test all permutations listed above is 150. A grid may be established that includes each of the unit cells. The particular layout may vary, however, FIG. 5 shows one example of a 14×12 grid 500 of individual cells. In FIG. 5, there are 99 cells of primary variable only elements marked as A, and the other cells are partially taken up by combinations that include secondary variables as well up in the number of cases shown above. In particular, the secondary variables of: Presence/Absence of RFP (marked as E); Local copper density variation (marked as D); Jog distance (marked as C); and z-Location (marked as B). Of course, many other configurations could be formed but, based on the selected variables, the 14×12 grid of unit cells, a skilled artisan that all cases described above have been tested and the sizing of the grid could be such that it fits under a particular die.

Figure 6:
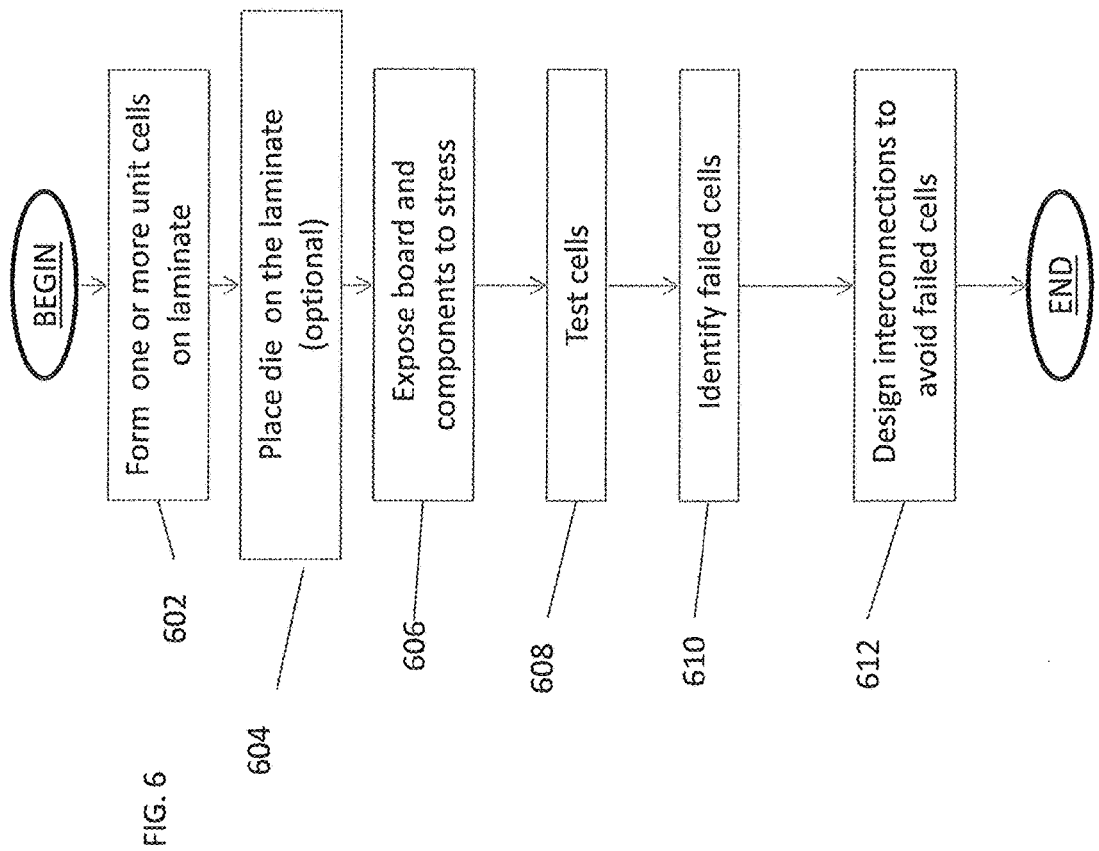
FIG. 6 is a flow chart showing one method to test a vias in a laminate.

FIG. 6 shows a flow chart of a method of testing a laminate according to one embodiment. At block 602 at least one unit cell is created in the laminate. Block 602 may include forming a grid of unit cells that have different configurations. Each unit cell, in one embodiment, may include at least one test via that traverses at least two levels. Optionally, the test via may be connected to either the top layer or core of the laminate but could also be a hanging via. Each cell may also include two or more dummy vias. The test via may be located in a center of the test cell as viewed from above. Some or all of cases of primary variables described above may be distributed over different unit cells in the grid as may the secondary. The particular, number of cells and different configurations, given the teachings herein, may be selected based on the needs of a particular lamination. Further, the creation may include providing connections from each level of the test via to a contact accessible to a probe such that every level of the via may be tested to determine if it is broken.

Block 604 is an optional step of placing a die over the unit cell. The die may have a lid on it, a heat sink on it, or both. Further, it shall be understood, the module so formed may be assembled to a circuit board.

At block 606 the laminate is subjected to an external stress. This stress may be a thermal cycle or may come from operation of the die on the laminate.

At block 608 one or more of the units cells are tested.

At block 610 unit cells that failed are noted and not used when a final connection design is created. That is, when laying out connections under the die, particular configurations may be excluded from the design process.

At block 612, a design is created that does not include failing configurations. At will be understood from the above, this may include excluding from a particular volume in a laminate any of the failed configurations.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A laminate comprising:
   a plurality of buildup layers disposed on a core;
   a plurality of unit cells defined in the buildup layers, each unit cell including:

at least one electrically conductive test via that passes electricity through at least three of the buildup layers and that is electrically connected to testing locations on a probe accessible location of the laminate, the test via including a separate probe accessible location for each build up layer that the test via passes through;

two or more dummy vias electrically connected to the at least one test via disposed in the unit cell;

wherein the dummy vias are arranged in the unit cell at one of a plurality of distances from the test via;

wherein each separate probe accessible location is connected to the test via by a test trace that passes through one of the dummy vias.

2. The laminate of claim 1, wherein the unit cells are arranged in a grid that is sized to correspond to a size of a computer chip.

3. The laminate of claim 2, wherein the unit cells are located in a position in the grid that correspond to a center of the chip, a point between a center of a chip and an edge of the chip, or a corner of the chip.

4. The laminate of claim 1, wherein the probe accessible location is a portion of a bottom of the laminate.

5. The laminate of claim 1, wherein the one or more of the unit cells includes resin fill plated through holes.

6. The laminate of claim 1, wherein the one or more of the unit cells includes different copper densities.

7. The laminate of claim 1, wherein the test via passes through at least four build layers and includes a top via section passing through two build layers and a bottom section via section passing through least two different build up layers than the top via section and is connected to the top via section by a jog connection across a top of one of the buildup layers.

8. The laminate of claim 1, wherein the one or more of the unit cells includes a dummy via that is hanging and does not contact either the top or bottom build-up layer.

9. A module including:
    a laminate comprising:
        a plurality of buildup layers disposed on a core;
        a plurality of unit cells defined in the buildup layers, each unit cell including:
            at least one electrically conductive test via that passes electricity through at least three of the buildup layers and that is electrically connected to testing locations on a probe accessible location of the laminate, the test via including a separate probe accessible location for each build up layer that the test via passes through; and
            two or more dummy vias electrically connected to the at least one test via, wherein the probe locations are electrically connected to both the test probe and at least one of the dummy vias;
            wherein the dummy vias are arranged in the unit cell at one of a plurality of distances from the test via;
            wherein each separate probe accessible location is connected to the test via by a trace that passes through one of the dummy vias; and
    a die connected to the laminate.

10. The module of claim 9, wherein the unit cells are arranged in a grid that is sized to correspond to a size of the die.

11. The module of claim 10, wherein the unit cells are located in a position in the grid that correspond to a center of the die, a point between a center of the via and an edge of the die, or a corner of the die.

* * * * *